(12) United States Patent
Hai et al.

(10) Patent No.: US 12,205,402 B2
(45) Date of Patent: Jan. 21, 2025

(54) DISPLAY SUBSTRATE, DISPLAY DEVICE, AND FINGERPRINT RECOGNITION METHOD

(71) Applicant: BOE Technology Group Co., Ltd., Beijing (CN)

(72) Inventors: Xiaoquan Hai, Beijing (CN); Xue Dong, Beijing (CN); Xiaochuan Chen, Beijing (CN); Lei Wang, Beijing (CN); Yingzi Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/577,246

(22) PCT Filed: Aug. 24, 2021

(86) PCT No.: PCT/CN2021/114371
§ 371 (c)(1),
(2) Date: Jan. 6, 2024

(87) PCT Pub. No.: WO2023/023953
PCT Pub. Date: Mar. 2, 2023

(65) Prior Publication Data
US 2024/0312241 A1    Sep. 19, 2024

(51) Int. Cl.
*G06V 40/13*    (2022.01)
*G06F 3/044*    (2006.01)
(Continued)

(52) U.S. Cl.
CPC ........ *G06V 40/1318* (2022.01); *G06F 3/0446* (2019.05); *G06V 40/1341* (2022.01);
(Continued)

(58) Field of Classification Search
CPC ............ G06V 40/1318; G06V 40/1341; G06F 3/0446; H01L 25/0753; H01L 25/167; H01L 33/44
See application file for complete search history.

(56) References Cited

U.S. PATENT DOCUMENTS 9,811,710 B2* 11/2017 Gao .................. G06V 40/1329
2021/0110131 A1  4/2021 Lin et al.
(Continued)

FOREIGN PATENT DOCUMENTS

| CN | 110210353 A | 9/2019 |
| CN | 112764659 A | 5/2021 |

(Continued)

OTHER PUBLICATIONS

PCT/CN2021/114371 international search report dated May 19, 2022.

*Primary Examiner* — Antonio Xavier
(74) *Attorney, Agent, or Firm* — IPro, PLLC

(57) ABSTRACT

Disclosed is a display substrate including: a base substrate; a plurality of light-emitting devices arranged in an array on the base substrate; a plurality of photosensitive devices between the layer including the light-emitting devices and the base substrate, the orthographic projections of the photosensitive devices on the base substrate overlapping the orthographic projections of the gaps between adjacent light-emitting devices; a black matrix on the side of the layer including the light-emitting devices away from the base substrate, the orthographic projection of the black matrix on the base substrate overlapping the orthographic projections of the gaps between the adjacent light-emitting devices, the black matrix having a plurality of first openings, the orthographic projections of the first openings on the base substrate overlapping the orthographic projections of the pho- (Continued)

tosensitive devices, and the total amount of light irradiated to the photosensitive devices through the first openings meeting a requirement.

15 Claims, 14 Drawing Sheets

(51) Int. Cl.
*G06V 40/12* (2022.01)
*H01L 25/075* (2006.01)
*H01L 25/16* (2023.01)
*H01L 33/44* (2010.01)

(52) U.S. Cl.
CPC ........ *H01L 25/0753* (2013.01); *H01L 25/167* (2013.01); *H01L 33/44* (2013.01)

(56) References Cited

U.S. PATENT DOCUMENTS

| | | | |
|---|---|---|---|
| 2022/0271103 A1 | 8/2022 | Hai et al. | |
| 2023/0161088 A1* | 5/2023 | Sun | B32B 7/12 359/356 |

FOREIGN PATENT DOCUMENTS

| | | |
|---|---|---|
| CN | 112800808 A | 5/2021 |
| CN | 112861763 A | 5/2021 |

\* cited by examiner

DISPLAY SUBSTRATE, DISPLAY DEVICE, AND FINGERPRINT RECOGNITION METHOD

CROSS REFERENCE TO RELATED APPLICATIONS

This application is a national phase entry under 35 U.S.C. § 371 of International Application No. PCT/CN2021/114371, filed on Aug. 24, 2021, the entire content of which is incorporated herein by reference.

TECHNICAL FIELD

The application relates to the field of display technology, in particular to a display substrate, a display device, and a fingerprint recognition method.

BACKGROUND

With the advancement of terminal technology, electronic devices have become more widely used. In order to protect the information security of users, a fingerprint recognition function has been popularised on an increasing number of electronic devices for unlocking mobile phones, mobile payment (e.g. payment, money transfer) and so on.

SUMMARY

Embodiments of the disclosure provide a display substrate, a display device, and a fingerprint recognition method. Specific solutions are as follows.

In an aspect, an embodiment of the disclosure provides a display substrate. The display substrate includes: a substrate; a plurality of light-emitting devices arranged in an array on the substrate; a plurality of photosensitive devices between a layer where the light-emitting devices are located and the substrate, where an orthographic projection of each photosensitive device on the substrate overlaps a gap between orthographic projections of adjacent light-emitting devices; and a black matrix located on a side of the layer where the light-emitting devices are located facing away from the substrate. An orthographic projection of the black matrix on the substrate overlaps the gap between orthographic projections of adjacent light-emitting devices, the black matrix has a plurality of first openings, and an orthographic projections of the first opening on the substrate overlaps the orthographic projection of the photosensitive device; and the total amount of light irradiating the photosensitive devices through the first openings satisfies a requirement of a signal-to-noise ratio of fingerprint recognition and is less than an amount of light required for a full-well capacity of the photosensitive devices.

In some embodiments, in the display substrate provided in the embodiments of the disclosure, the first openings overlap photoelectric conversion layers of the photosensitive devices in a one-to-one correspondence manner, and a center of the orthographic projection of the first opening on the substrate approximately coincides with a center of an orthographic projection of the photoelectric conversion layer of the corresponding photosensitive device.

In some embodiments, in the display substrate provided in the embodiments of the disclosure, the orthographic projection of the first opening on the substrate is located within the orthographic projection of the photoelectric conversion layer of the corresponding photosensitive device.

In some embodiments, in the display substrate provided in the embodiments of the disclosure, an optical comprehensive transmittance T of ambient light reaching the photosensitive devices through a finger and the first openings satisfies the following expression:

$$0 < T < k * K_S * K_L;$$

where k is a coefficient, $K_S$ is a ratio of a width of the first opening to a width of the photoelectric conversion layer of the corresponding photosensitive device in a row direction, and $K_L$ is a ratio of a length of the first opening to a length of the photoelectric conversion layer of the corresponding photosensitive device in a column direction.

In some embodiments, in the display substrate provided in the embodiments of the disclosure, a light receiving angle α determined based on the first opening satisfies the following expression:

$$\alpha = \arctan[P/(2h_1)],$$
$$\text{and } 0 < (D_{LPIN} + D_{LBM})/(2*h_2) < \alpha;$$

where P is a distance between two adjacent valley centers or two adjacent ridge centers of a fingerprint, $h_1$ is a distance from a contact surface of a finger and the display substrate to the black matrix, $h_2$ is a distance from the black matrix to the photosensitive devices, $D_{LPIN}$ is the length of the photoelectric conversion layer of the photosensitive device in the column direction, and $D_{LBM}$ is the length of the first opening in the column direction.

In some embodiments, in the display substrate provided in the embodiments of the disclosure, $0<k<0.4$, $0<K_S<0.75$, $0<K_L<0.75$, 8 μm≤ $D_{LPIN}$≤40 μm, 50 μm≤ $h_1$≤200 μm, 8 μm≤$h_2$≤20.μm, 300 μm≤P≤500 μm, 8 μm≤$D_{SPIN}$≤20 μm. Here $D_{SPIN}$ is the width of the photoelectric conversion layer of the photosensitive device in the row direction.

In some embodiments, the display substrate provided in the embodiments of the disclosure further includes red resin filling the first openings. The orthographic projection of the first opening on the substrate is greater than or equal to the orthographic projection of the photoelectric conversion layer of the corresponding photosensitive device.

In some embodiments, in the display substrate provided in the embodiments of the disclosure, a ratio of a width of the first opening to a width of the photoelectric conversion layer of the corresponding photosensitive device in a row direction is greater than or equal to 1 and less than 2, and a ratio of a length of the first opening to a length of the photoelectric conversion layer of the corresponding photosensitive device in a column direction is greater than or equal to 1 and less than 2.

In some embodiments, the display substrate provided in the embodiments of the disclosure further includes a plurality of color resistors on a side of the black matrix away from the substrate, where the color resistors include red color resistors, and the red color resistors are disposed in the same layer and made of the same material as the red resin. The black matrix further includes a plurality of second openings, the color resistors are located at the second openings, and an orthographic projection of the color resistor on the substrate overlaps the orthographic projection of the light-emitting device.

In some embodiments, in the display substrate provided in the embodiments of the disclosure, every three adjacent photosensitive devices in the same row are a first photosensitive device, a second photosensitive device and a third photosensitive device respectively. In two adjacent rows, a column where the first photosensitive device is located is located between a column where the second photosensitive device is located and a column where the third photosensitive device is located. For the first photosensitive device, the second photosensitive device, and the third photosensitive device that are adjacent in the same row: a bottom electrode of the first photosensitive device is independent of a bottom electrode of the second photosensitive device and a bottom electrode of the third photosensitive device, and the bottom electrode of the second photosensitive device is electrically connected with the bottom electrode of the third photosensitive device; and an area of the photoelectric conversion layer of the photosensitive device which is not shielded by an anode of the light-emitting device is an effective photosensitive area, and an effective photosensitive area of the first photosensitive device is equal to a sum of an effective photosensitive area of the second photosensitive device and an effective photosensitive area of the third photosensitive device.

In some embodiments, in the display substrate provided in the embodiments of the disclosure, an orthographic projection of the photoelectric conversion layer of the photosensitive device on the substrate overlaps an edge, which extends in the column direction, of an orthographic projection of an anode of an adjacent light-emitting device.

In some embodiments, in the display substrate provided in the embodiments of the disclosure, an orthographic projection of the photoelectric conversion layer of the photosensitive device on the substrate does not overlap an orthographic projection of an anode of the light-emitting device.

In some embodiments, in the display substrate provided in the embodiments of the disclosure, the orthographic projection of the photoelectric conversion layer of the photosensitive device on the substrate is rectangular.

In some embodiments, in the display substrate provided in the embodiments of the disclosure, the photoelectric conversion layer of the first photosensitive device include a first photoelectric conversion layer and a second photoelectric conversion layer independent of each other.

In some embodiments, in the display substrate provided in the embodiments of the disclosure, orthographic projections of the first photoelectric conversion layer, the second photoelectric conversion layer, a photoelectric conversion layer of the second photosensitive device, and a photoelectric conversion layer of the third photosensitive device on the substrate are all square or circular.

In some embodiments, the display substrate provided in the embodiments of the disclosure further includes a touch grid layer between the layer where the light-emitting devices are located and the black matrix. An orthographic projection of the touch grid layer on the substrate is located within the orthographic projection of the black matrix, and the orthographic projection of the touch grid layer on the substrate does not overlap the orthographic projection of the photoelectric conversion layer of the photosensitive device.

In some embodiments, in the display substrate provided in the embodiments of the disclosure, a photoelectric conversion layer of one photosensitive device or an effective light-emitting layer of one light-emitting device is arranged in a region where any grid of the touch grid layer is located.

In some embodiments, in the display substrate provided in the embodiments of the disclosure, a width of a grid line of the touch grid layer extending in a column direction is half of a width of a grid line extending in other directions.

In some embodiments, in the display substrate provided in the embodiments of the disclosure, a photoelectric conversion layer of one photosensitive device and an effective light-emitting layer of one light-emitting device are arranged in a region where any grid of the touch grid layer is located.

In some embodiments, in the display substrate provided in the embodiments of the disclosure, widths of grid lines of the touch grid layer extending in all directions are approximately equal.

In some embodiments, the display substrate provided in the embodiments of the disclosure further includes an ultrathin glass cover plate on a side of the black matrix away from the substrate.

In another aspect, an embodiment of the disclosure further provides a display device. The display device includes the display substrate provided in the embodiment of the disclosure.

In yet another aspect, an example of the disclosure further provides a fingerprint recognition method. The fingerprint recognition method includes: detecting ambient light brightness; and determining whether the ambient light brightness is greater than preset brightness, in response to the ambient light brightness being greater than the preset brightness, using ambient light for fingerprint recognition; and in response to the ambient light brightness not being greater than the preset brightness, using light emitted from a light-emitting device for fingerprint recognition.

DETAILED DESCRIPTION

Figure 1:
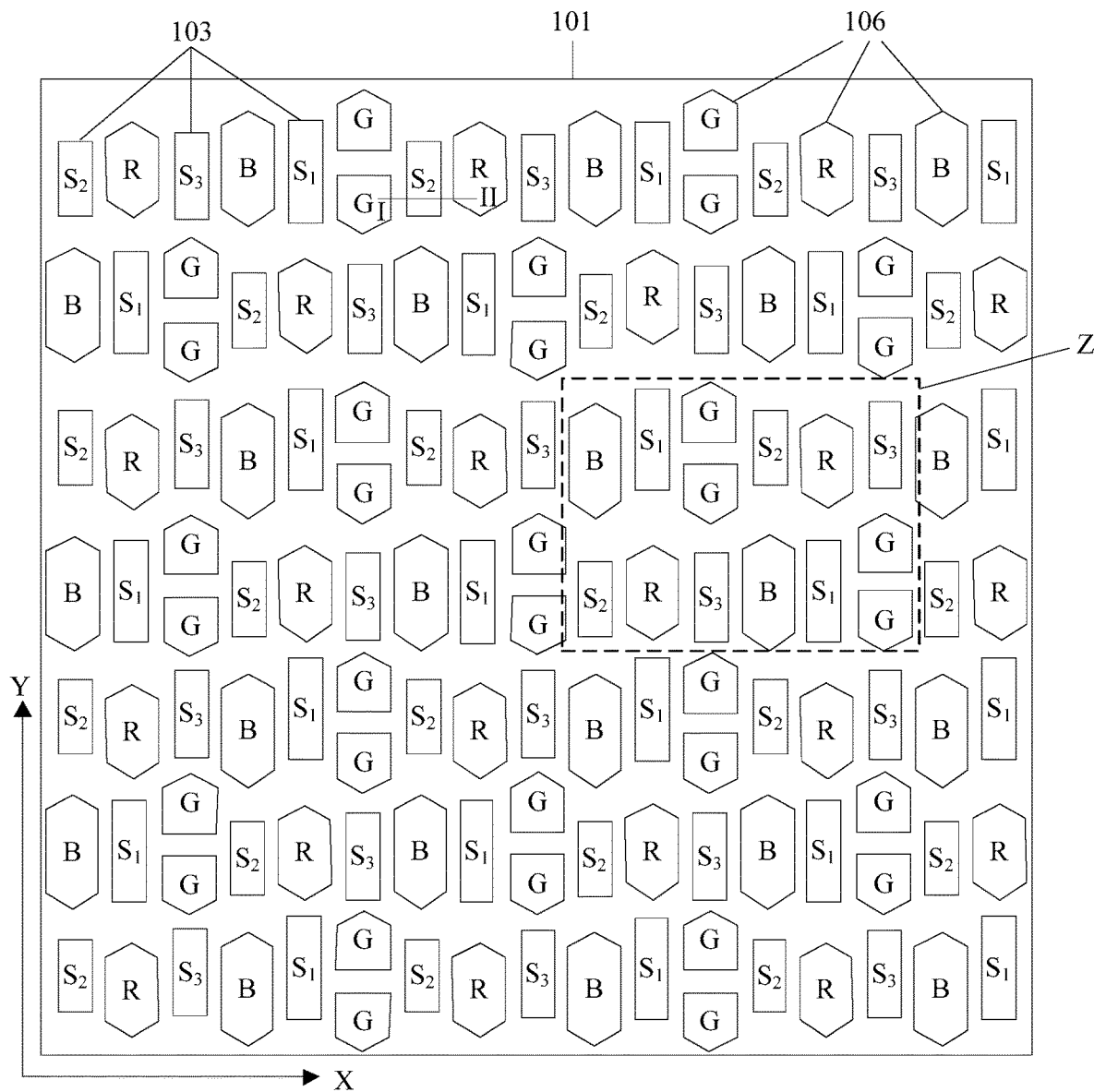
FIG. 1 is a schematic structural diagram of a display substrate provided in an embodiment of the disclosure.

In order to make the objectives, technical solutions, and advantages in the embodiments of the disclosure clearer, the technical solutions in the embodiments of the disclosure will be clearly and completely described below in conjunction with the accompanying drawings in the embodiments of the disclosure. It should be noted that sizes and shapes of all figures in the accompanying drawings do not reflect true scales, and are merely intended to illustrate contents of the disclosure. Moreover, the same or similar reference numerals denote the same or similar elements or elements having the same or similar functions throughout.

Unless otherwise defined, technical or scientific terms used herein should have ordinary meanings as understood by those of ordinary skill in the art to which the disclosure belongs. "First", "second" and similar words used in the specification and claims of the disclosure do not mean any order, quantity or importance, but are only used for distinguishing different components. "Comprise", "include" and similar words are intended to mean that an element or item in front of the word encompasses elements or items that are listed behind the word and their equivalents, but do not exclude other elements or items. "Inner", "outer", "upper", "lower", etc. are merely used to indicate a relative positional relation, and when an absolute position of the described object is changed, the relative positional relation can also be changed accordingly.

In related art, optical fingerprint recognition works as follows. When a finger is placed above a display product, light emitted from a light-emitting device of the display product irradiates a valley and a ridge of the finger, is reflected by the valley and ridge of the finger, and then is incident on a photosensitive device of the display product. Since reflected light intensity at the valley and the ridge is different, the photosensitive device generates different electric signals according to a difference of the reflected light intensity, so as to get fingerprint recognised. It can be seen that in the related art, light from display product is used as a light source for fingerprint recognition. However, light with wavelength greater than 600 nm in external ambient light will pass through the finger and irradiates the photosensitive device to affect fingerprint imaging, which influences user experience.

Figure 2:
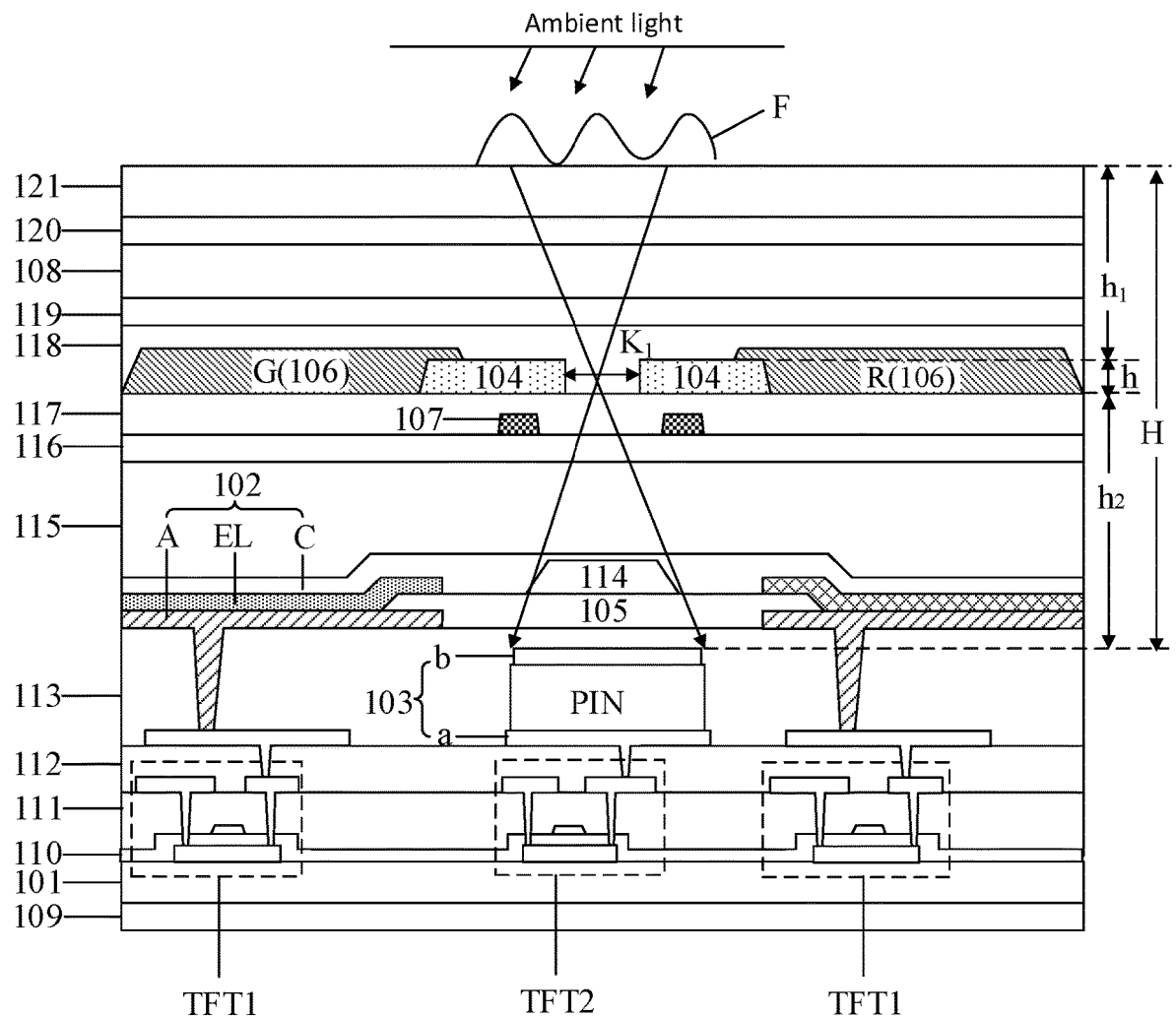
FIG. 2 is a schematic diagram of a sectional view along line I-II in FIG. 1.
Figure 3:
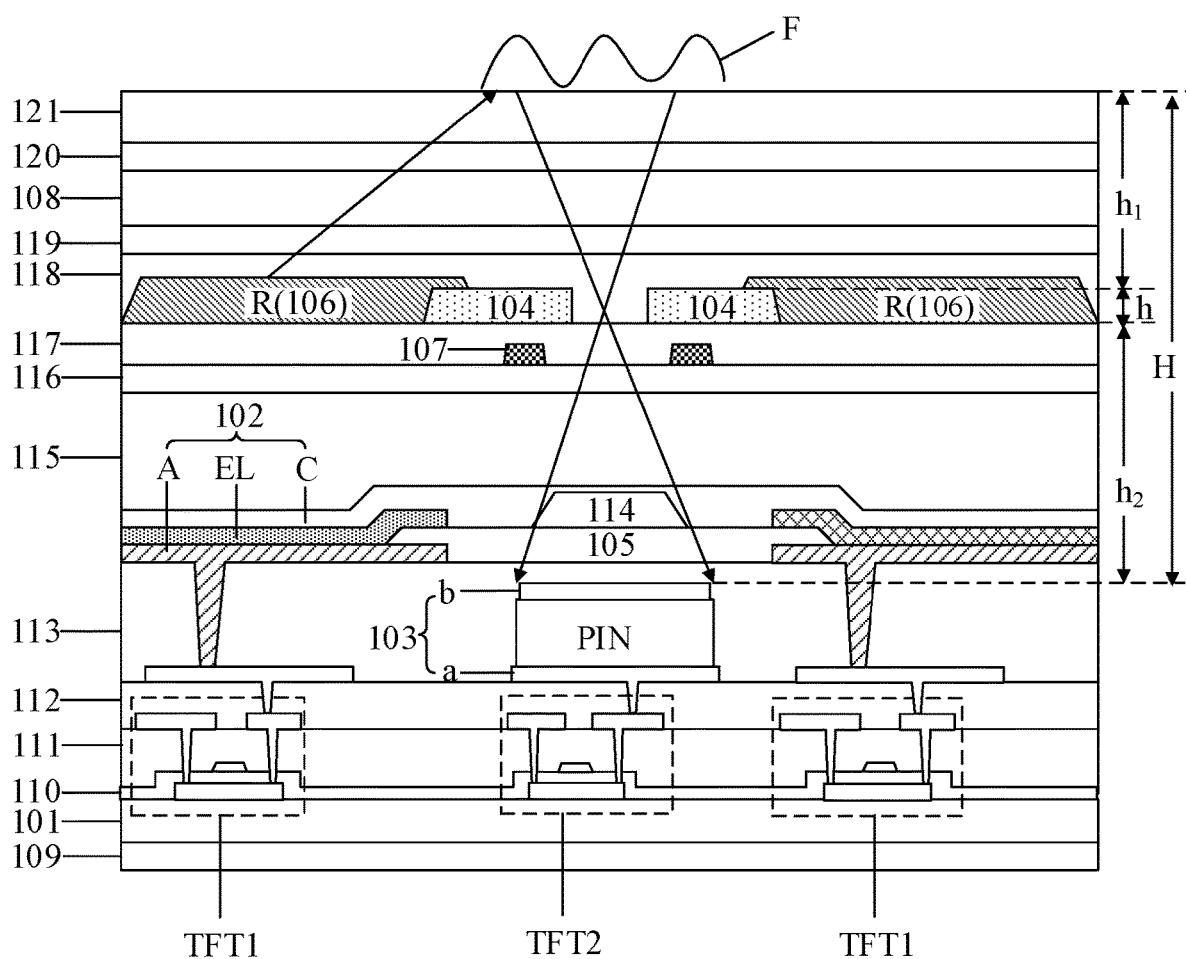
FIG. 3 is a schematic diagram showing that a display substrate shown in FIG. 2 performs fingerprint recognition with light emitted from a light-emitting device.

In order to improve the above technical problems existing in the related art, embodiments of the disclosure provide a display substrate, as shown in FIGS. 1-3, including:

a substrate 101;

a plurality of light-emitting devices 102 arranged in an array on the substrate 101;

a plurality of photosensitive devices 103 between a layer where the light-emitting devices 102 are located and the substrate 101, where an orthographic projection of each photosensitive device 103 on the substrate 101 overlaps a gap between orthographic projections of adjacent light-emitting devices 102; and a black matrix 104 on a side of the layer including the light-emitting devices 102 facing away from the substrate 101, where an orthographic projection of the black matrix 104 on the substrate 101 overlaps the gap between orthographic projections of adjacent light-emitting devices 102, the black matrix 104 has a plurality of first openings $K_1$, and an orthographic projection of the first opening $K_1$ on the substrate 101 overlaps the orthographic projection of the photosensitive device 103. The total amount of light irradiating the photosensitive devices 103 through the first openings $K_1$ satisfies a requirement of a signal-to-noise ratio (SNR) of fingerprint recognition and is less than a light amount required for a full-well capacity of the photosensitive devices 103. Incident light of the first opening $K_1$ is ambient light transmitted through a finger or emitted light from the light-emitting device 102 reflected by a finger.

In the above display substrate provided in the embodiments of the disclosure, based on the cooperation between the first opening $K_1$ and the photosensitive device 103 thereunder, when the total amount of ambient light irradiating the photosensitive device 103 through the finger F and the first opening $K_1$ satisfies the requirement of the signal-to-noise ratio of fingerprint recognition and is less than the light amount required for the full-well capacity of the photosensitive device 103, fingerprint recognition can be performed by using the ambient light. When the ambient light is weak and cannot satisfy the requirement of the signal-to-noise ratio of fingerprint recognition, fingerprint recognition can be performed by using the light emitted from the light-emitting device 102. Therefore, the display substrate provided in the disclosure can allow both the ambient light and display light for fingerprint recognition, which is conducive to improvement in user experience and increase in core competitiveness of products.

In some embodiments, as shown in FIGS. 2 and 3, the photosensitive device 103 provided in embodiments of the disclosure may include a bottom electrode a, a photoelectric conversion layer PIN, and a top electrode b stacked. The photoelectric conversion layer PIN may include a P-type semiconductor layer, an I-type semiconductor layer (also referred to as an intrinsic semiconductor layer), and an N-type semiconductor layer stacked. The photoelectric conversion layer PIN and the top electrode b may be formed using in one patterning process. Optionally, in order to reduce a leakage current, an orthographic projection of the top electrode b on the substrate 101 needs to be slightly less than an orthographic projection of the photoelectric conversion layer PIN on the substrate 101. For example, a distance between a boundary of an orthographic projection of the top electrode on the substrate 101 and a boundary of the orthographic projection of the photoelectric conversion layer PIN on the substrate 101 may be 0.5 μm-2 μm.

In some embodiments, as shown in FIGS. 2 and 3, the light-emitting device 102 provided in embodiments of the disclosure may include an anode A, a light-emitting functional layer EL, and a cathode C stacked. The light-emitting functional layer EL may include, but is not limited to, a hole injection layer, a hole transport layer, an electron blocking layer, a light-emitting material layer, a hole blocking layer, an electron transport layer, and an electron injection layer. The light-emitting function layer EL located within a pixel opening of a pixel defining layer 105 is an effective light-emitting layer of the light-emitting device 102. The light-emitting device 102 includes, but is not limited to, a red light device, a green light device, and a blue light device.

In some embodiments, as shown in FIGS. 1-3, the black matrix 104 provided in the embodiments of the disclosure may further include a second opening $K_2$ of which an orthographic projection overlaps an orthographic projection of the light-emitting device 102, and a color resistor 106 is arranged in the second opening $K_2$. Optionally, in order to improve color purity, an orthographic projection of the color resistor 106 on the substrate 101 covers and is greater than an orthographic projection of the effective light-emitting layer of the light-emitting device 102 on the substrate 101. Optionally, the color resistor 106 may include a red color resistor R, a green color resistor G, and a blue color resistor B. The red light device is located below the red color resistor R, the green light device is located below the green color resistor G, and the blue light device is located below the blue color resistor B.

Figure 4:
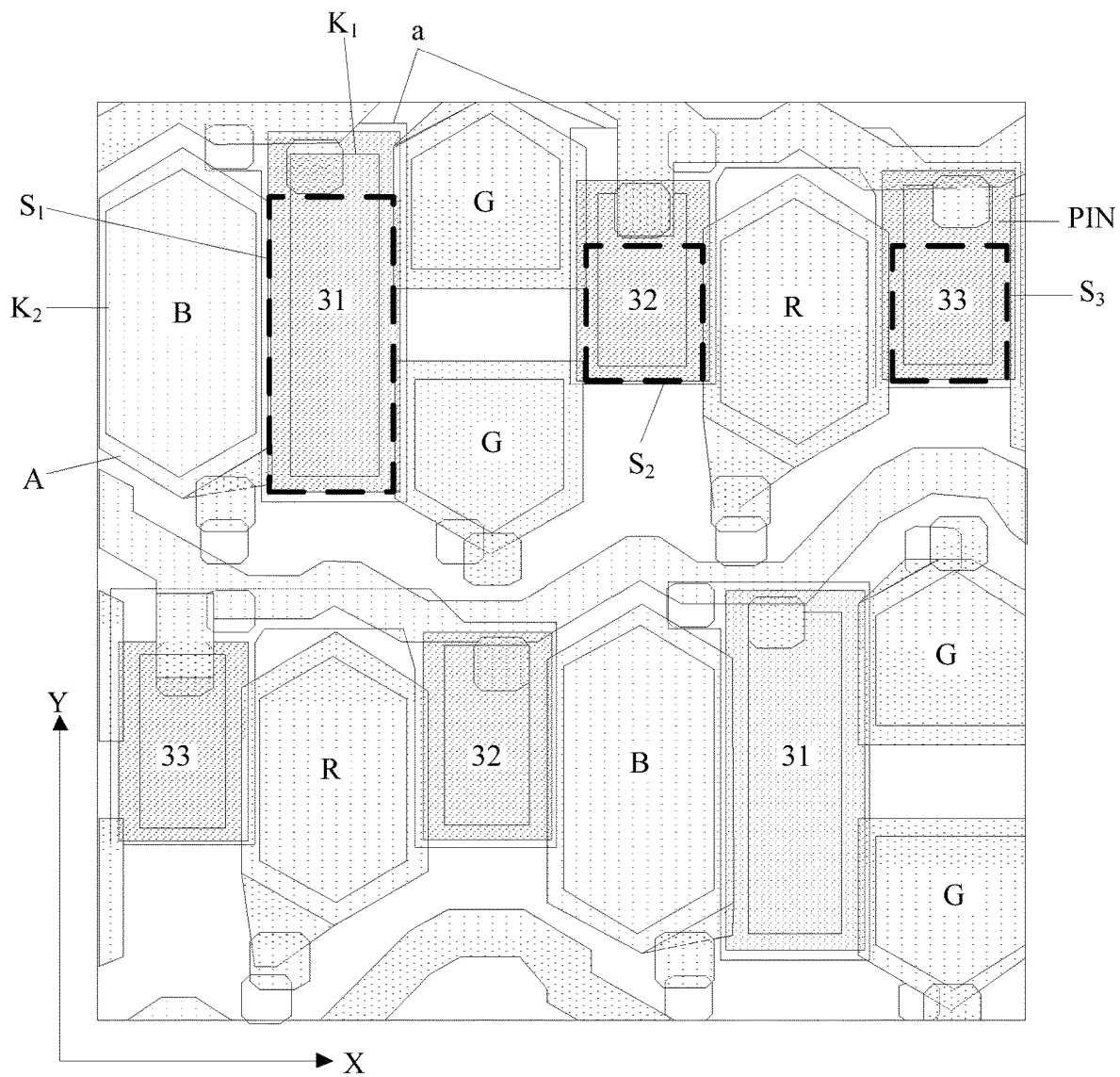
FIG. 4 is a schematic structural diagram of region Z shown in FIG. 1.
Figure 5:
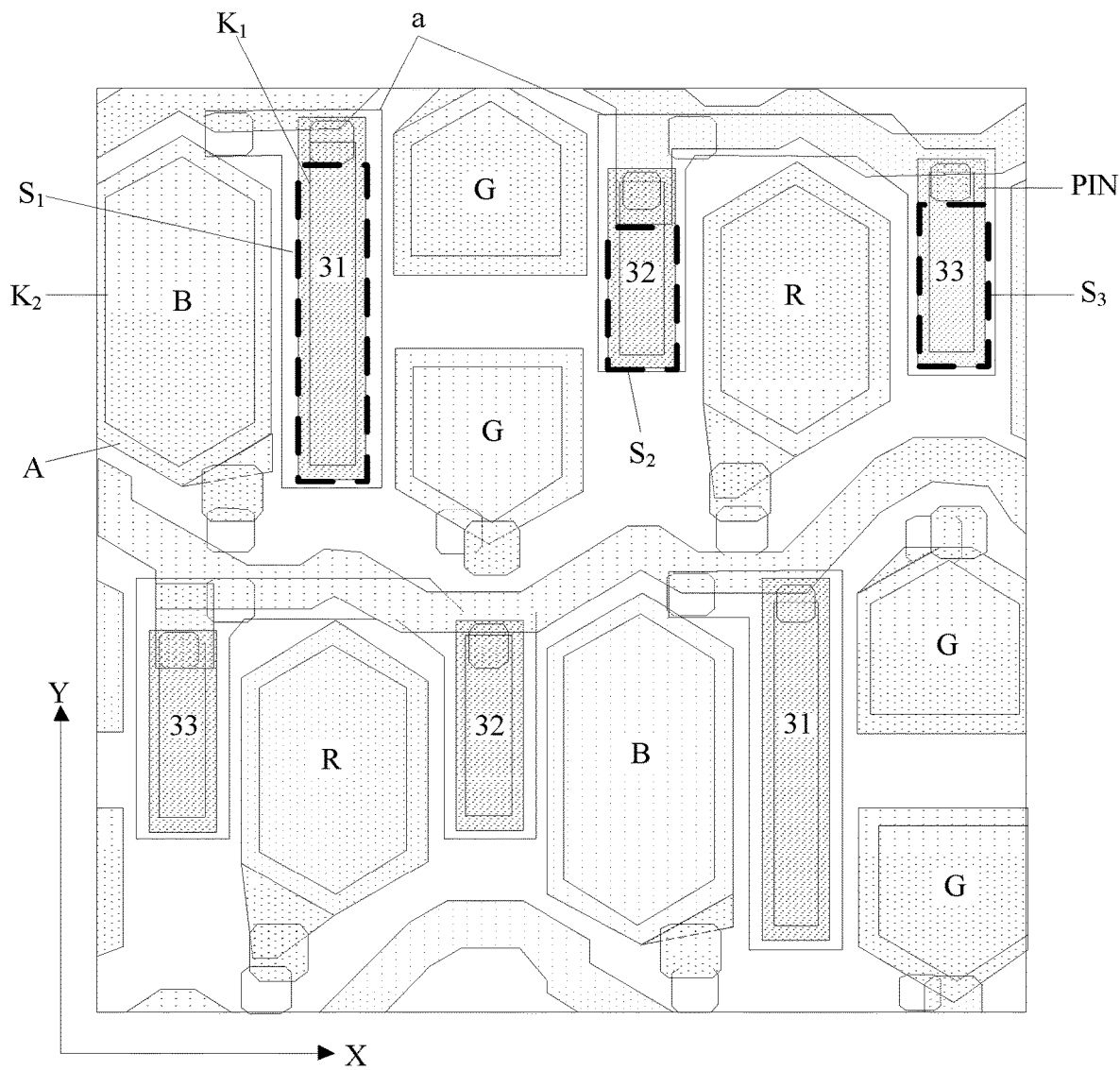
FIG. 5 is another schematic structural diagram of region Z shown in FIG. 1.
Figure 6:
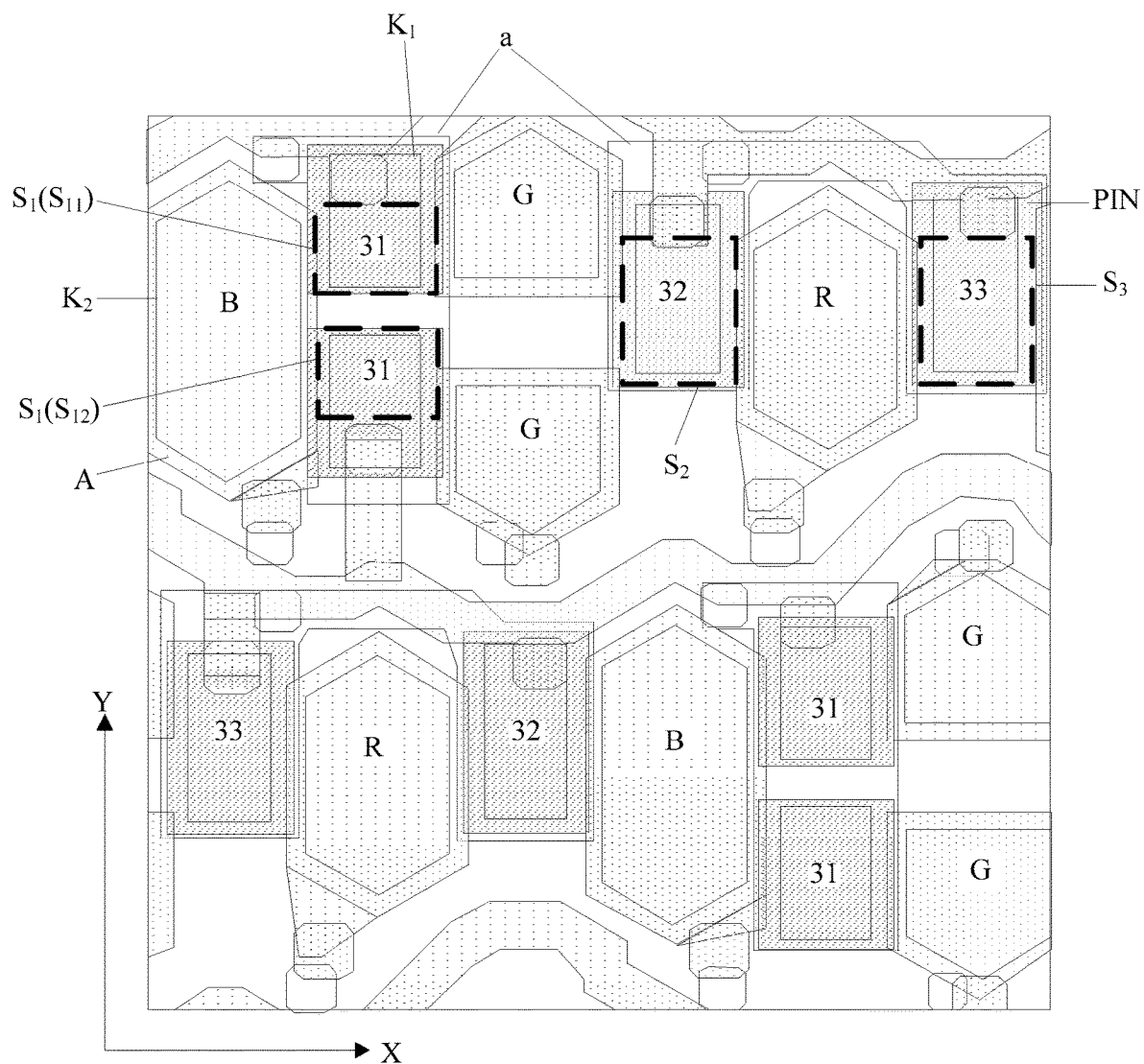
FIG. 6 is yet another schematic structural diagram of region Z shown in FIG. 1.

In some embodiments, in the above display substrate provided in the embodiments of the disclosure, as shown in FIGS. 4-6, the first openings $K_1$ and the photoelectric conversion layers PIN of the photosensitive devices 103 overlap in a one-to-one correspondence mode. Centers of orthographic projections of the first openings $K_1$ on the substrate 101 approximately coincide with centers of orthographic projections of the photoelectric conversion layers PIN of the corresponding photosensitive devices 103, such that each first opening $K_1$ may allow light transmitted therethrough to have a desirable collimation effect, and to completely irradiate the corresponding photoelectric conversion layer PIN, and then fingerprint imaging quality is improved.

It should be noted that, in the embodiments provided in the disclosure, due to the limitation of process conditions or the influence of other factors such as measurement, the above "approximate" may refer to the related ones being completely identical, or it may have some differences. As long as the difference between the related ones is within the tolerance (for example, a fluctuation of about 5% or a distance of offset of 0 μm-1 μm), the cases belongs to the scope of protection of the disclosure.

In some embodiments, in the display substrate provided in the embodiments of the disclosure, as shown in FIGS. 4-7, the orthographic projection of the first opening $K_1$ on the substrate 101 may be located within the orthographic projection of the photoelectric conversion layer PIN in the corresponding photosensitive device 103. Based on a size of the photoelectric conversion layer PIN, the first opening $K_1$ is set with a smaller size, the total amount of light transmitted through first opening $K_1$ can be effectively adjusted, such that the total amount of light received by the photoelectric conversion layer PIN below the first opening $K_1$ satisfies the requirement of the signal-to-noise ratio of fingerprint recognition and is less than the light amount required for the full-well capacity of the photosensitive device 103, and then fingerprint information can be obtained through the photosensitive device 103.

It should be noted that in the related art, in order to avoid interference from ambient light, green resin is typically arranged above the photosensitive device 103, which increases mass production cost and reduces product competitiveness. In the above embodiments, by adjusting the size of the first opening $K_1$, the ambient light can be effectively utilized for fingerprint recognition, setting of green resin is avoided, the mass production cost is reduced, and the product competitiveness is improved.

Since the size of the first opening $K_1$ has a positive correlation with the total amount of light transmitted therethrough, when the ambient light brightness is particularly large (for example, greater than or equal to 10 W lx), the first opening with a smaller size can be set to match the ambient light brightness. Therefore, the total amount of ambient light transmitted through the first opening $K_1$ and irradiating the photosensitive device 103 is not greater than the amount of light required for the full-well capacity of the photosensitive device 103. However, due to the influence of factors such as a current manufacturing process and apparatus precision, the less the size of the first opening $K_1$ is, the greater the difficulty for manufacturing the first opening is, and even the first opening $K_1$ cannot be produced.

Figure 7:
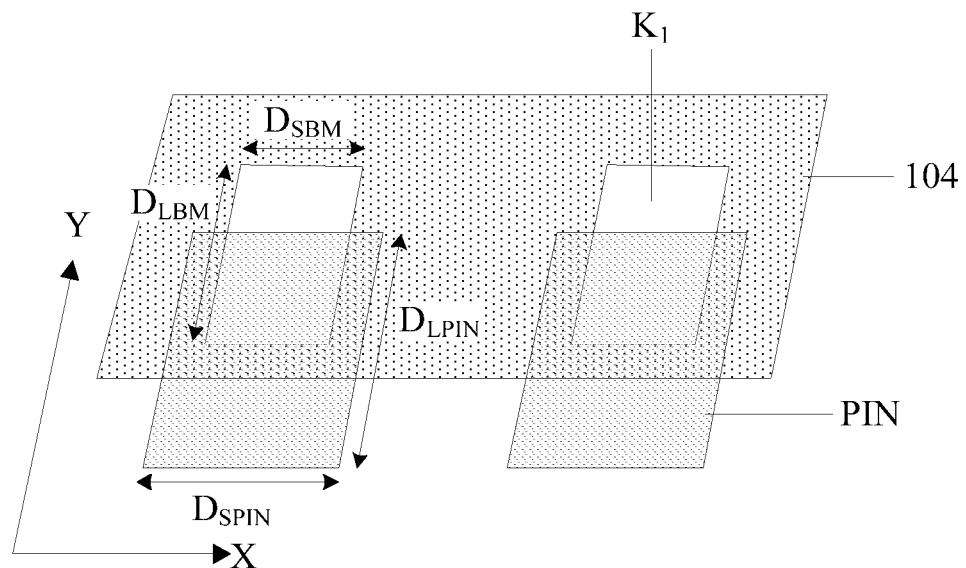
FIG. 7 shows a size comparison between a first opening and a photoelectric conversion layer provided in an embodiment of the disclosure.
Figure 8:
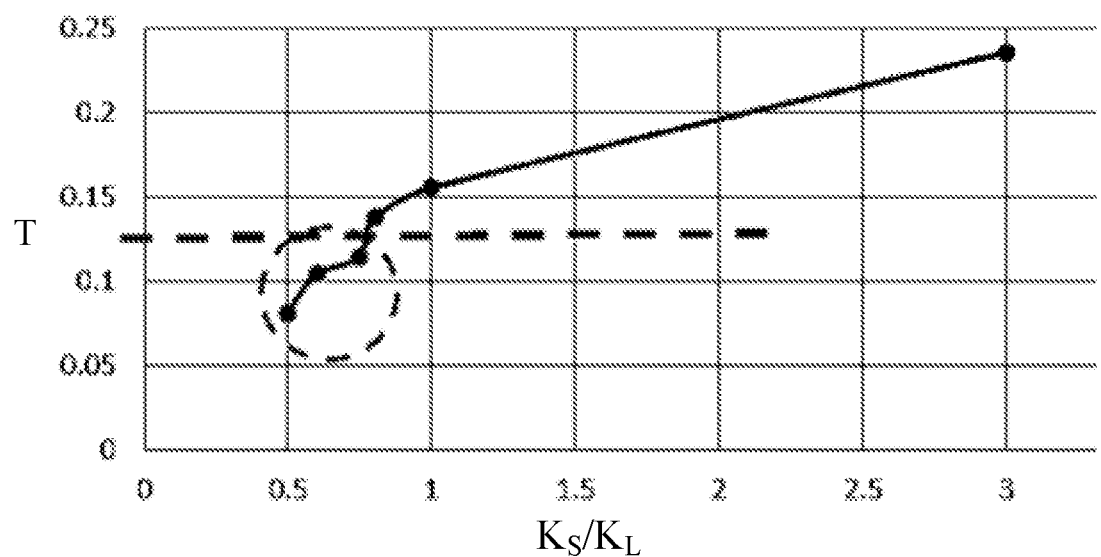
FIG. 8 is a curve chart between sizes of a first opening and a photoelectric conversion layer and an optical comprehensive transmittance.

In view of this, the size of the first opening $K_1$ cannot be too small, such that when the size of the first opening $K_1$ is guaranteed for manufacturing, in order to avoid the situation that fingerprint recognition cannot be implemented because the total amount of light irradiating the photosensitive device 103 through the finger and the first opening $K_1$ exceeds the amount of light required for the full-well capacity of the photosensitive device 103 due to excessive ambient light brightness, .as shown in FIGS. 7 and 8, in the disclosure, an optical comprehensive transmittance T of the ambient light reaching the photosensitive device 103 through the finger and the first opening $K_1$ needs to satisfy the following expression:

$$0 < T < k * K_s * K_L;$$

here k is a coefficient, $K_S$ is a ratio of a width of the first opening $K_1$ to a width of the photoelectric conversion layer PIN of the corresponding photosensitive devices 103 in a row direction X, and $K_L$ is a ratio of a length of the first opening $K_1$ to a length of the photoelectric conversion layer PIN of the corresponding photosensitive device 103 in a column direction Y. Optionally, 0<T<0.15, preferably 0<T≤0.1267.

Figure 9:
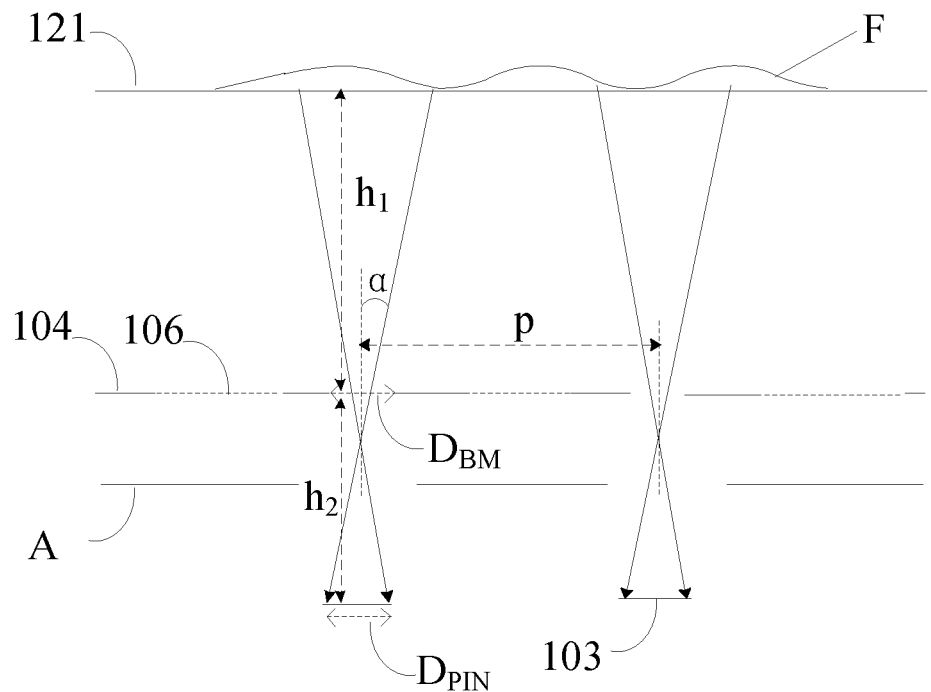
FIG. 9 is a schematic diagram illustrating fingerprint imaging using a display substrate shown in FIG. 2 as provided in an embodiment of the disclosure.

Accordingly, as shown in FIG. 9, a light receiving angle α determined based on the first opening $K_1$ satisfies the following expression:

$$\alpha = \arctan[P/(2h_1)],$$

$$\text{and } 0 < (D_{LPIN} + D_{LBM})/(2 * h_2) < \alpha;$$

here P is a distance between two adjacent valley centers or two adjacent ridge centers of a fingerprint, $h_1$ is a distance from a contact surface of a finger and the display substrate to the black matrix 104, $h_2$ is a distance from the black matrix 104 to the photosensitive devices 103, $D_{LPIN}$ is the length of the photoelectric conversion layer PIN of the photosensitive device 103 in the column direction Y, and $D_{LBM}$ is the length of the first opening $K_1$ in the column direction Y.

In some embodiments, 0<k<0.4, 0<$K_S$<0.75, 0<$K_L$<0.75, 8 μm≤ $D_{LPIN}$≤40 μm, 50 μm≤ $h_1$≤200 μm, 8 μm≤ $h_2$≥20 μm, 300 μm≤ P≤500 μm, a width $D_{SPIN}$ of the photoelectric conversion layer PIN of the photosensitive device 103 in the row direction X satisfies: 8 μm≤ $D_{SPIN}$≤20 μm, and a range of a center-to-center distance p of adjacent first openings satisfies: 20 μm≤p≤80 μm, as shown in FIG. 9.

Table 1 shows fingerprint evaluation data for different ratios between the first opening $K_1$ and the photoelectric conversion layer PIN. It can be seen from Table 1 that when a ratio of a side length of the first opening $K_1$ to a side length the photoelectric conversion layer PIN is less than 0.75, the optical comprehensive transmittance T of ambient light is below 12.67%, and fingerprint recognition can be implemented by using the ambient light.

TABLE 1

| Structure | Light receiving angle/central transmittance | Distance from finger contact surface to photosensitive device (μm) | Light source (lm) | Side length ratio of first opening to PIN | Effective photosensitive area of PIN (μm²) | Optical comprehensive transmittance T (<12.67%) | Valley-ridge illumination difference |
|---|---|---|---|---|---|---|---|
| No black matrix | —/1 | 220 | 350 | — | 420 | 23.5% | 0.40 |
| Black matrix having first opening. | 61°/1 | | | 1:1 | | 15.5% | 0.50 |
| | 60°/0.69 | | | 4:5 | | 13.7% | 0.334 |
| | 60°/0.56 | | | 3:4 | | 11.4% | 0.251 |
| | 56°/0.44 | | | 2:3 | | 10.4% | 0.21 |
| | 53°/0.25 | | | 1:2 | | 8.1% | 0.147 |

Figure 10:
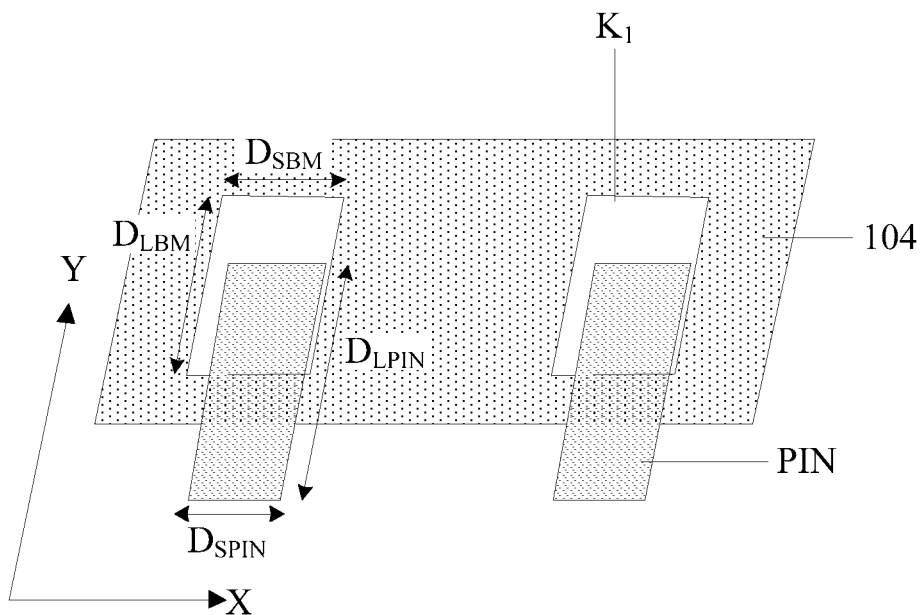
FIG. 10 shows another size comparison between a first opening and a photoelectric conversion layer provided in an embodiment of the disclosure.
Figure 11:
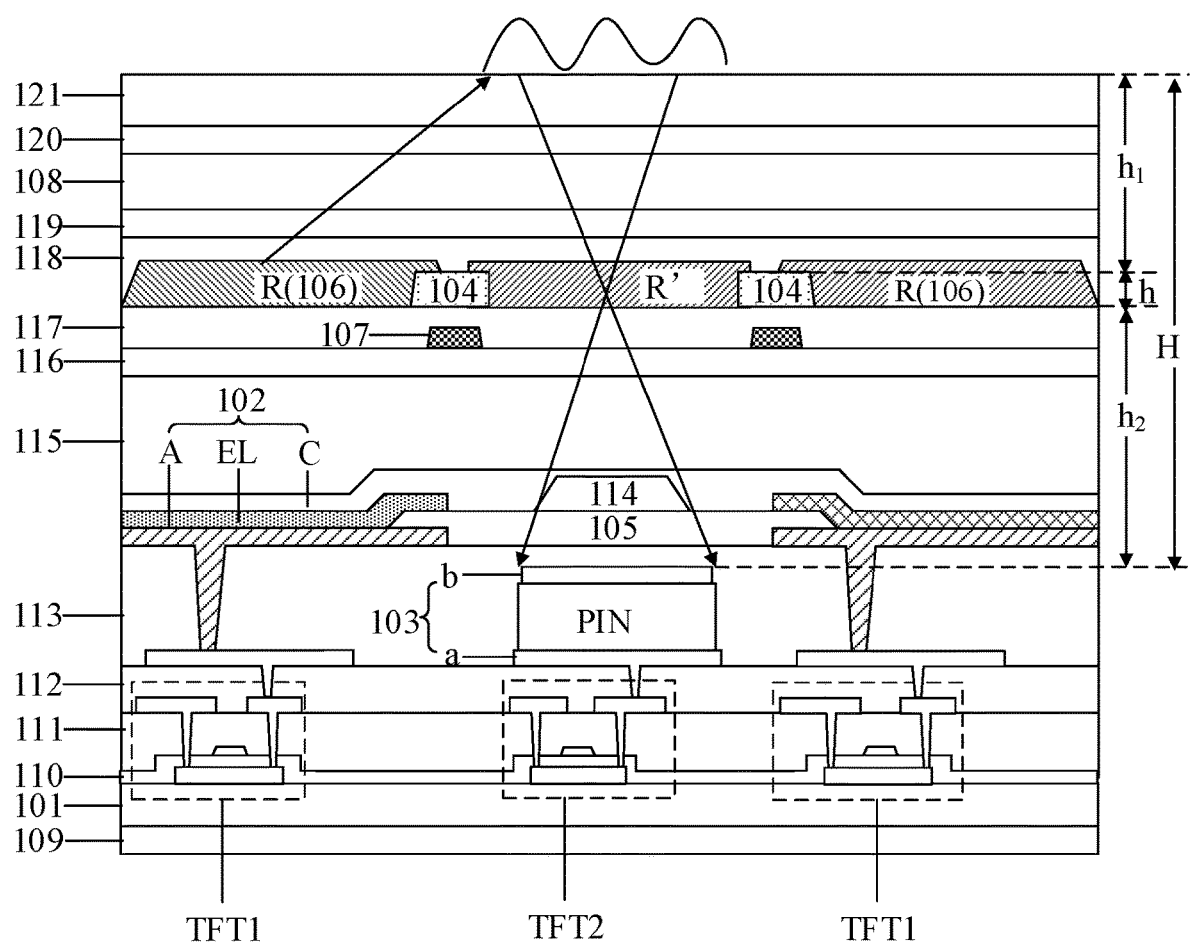
FIG. 11 is another schematic diagram of a sectional view along line I-II in FIG. 1.

In some embodiments, in the display substrate provided in the embodiments of the disclosure, as shown in FIGS. 10 and 11, in order to facilitate the fabrication of the first opening $K_1$, the size of the first opening $K_1$ may be relative large. Specifically, an orthographic projection of the first opening $K_1$ on the substrate 101 may be greater than or equal to an orthographic projection of the photoelectric conversion layer PIN of the corresponding photosensitive device 103. In order to avoid excessive light irradiating the photosensitive device 103, the first opening $K_1$ may be filled with red resin R'. Since light rays with wavelength greater than 600 nm in ambient light can pass through fingers, red light can be effectively transmitted through the red resin R', and light rays in a wavelength band such as a near-infrared wavelength band greater than the wavelength of red light can be blocked, such that the total amount of light received by the photosensitive device 103 can be reduced, and a situation that fingerprint recognition fails since the total amount of light exceeds the amount of light required for the full-well capacity of the photosensitive device 103 is prevented.

Generally, the black matrix 104 further includes a second opening $K_2$ provided with a color resistor 106. The light emitted from the light-emitting device 102 is emitted through the color resistor 106, to implement a display function. Therefore, in the case where the first opening $K_1$ is relative large, in order to balance the fingerprint recognition effect and a display effect, the size of the first opening $K_1$ needs to be reasonably set. Based on this, in some embodiments, a ratio $K_S$ of the width of the first opening $K_1$ to the width of the photoelectric conversion layer PIN of the corresponding photosensitive device 103 in the row direction X may be greater than or equal to 1 and less than 2, and a ratio $K_L$ of the length of the first opening $K_1$ to the length of the photoelectric conversion layer PIN of the corresponding photosensitive device 103 in the column direction Y may be greater than or equal to 1 and less than 2.

In some embodiments, in the above display substrate provided in the embodiments of the disclosure, the red resin R 'filling the first opening $K_1$ may be disposed in the same layer and made of the same material as the red color resistor R. That is, the red resin R' and the red color resistor R are formed by patterning the same red resin material film layer, such that the number of film layers and production cost can be reduced.

In some embodiments, in the display substrate provided in the embodiments of the disclosure, as shown in FIGS. 4-6, every three adjacent photosensitive devices 103 in the same row refer to as a first photosensitive device 31, a second photosensitive device 32 and a third photosensitive device 33 respectively. In two adjacent rows, a column where the first photosensitive device 31 is located is located between a column where the second photosensitive device 32 is located and a column where the third photosensitive device 33 is located.

For the first photosensitive device 31, the second photosensitive device 32, and the third photosensitive device 33 that are adjacent in the same row:
a bottom electrode a of the first photosensitive device 31 is independent of a bottom electrode a of the second photosensitive device 32 and a bottom electrode a of the third photosensitive device 33, and the bottom electrode a of the second photosensitive device 32 is electrically connected with the bottom electrode a of the third photosensitive device 33;
an area of the photoelectric conversion layer PIN of the photosensitive device 103 which is not shielded by an anode A of the light-emitting device 102 is an effective photosensitive area, an effective photosensitive area $S_1$ of the first photosensitive device 31 is equal to a sum of an effective photosensitive area $S_2$ of the second photosensitive device 32 and an effective photosensitive area $S_3$ of the third photosensitive device 33.

The above arrangement of the photosensitive devices 103 can allow the photosensitive devices 103 to be uniformly distributed in gaps between the light-emitting devices 102, and areas of the photoelectric conversion layers PIN in all detection pixels are substantially the same, such that the uniformity of fingerprint imaging can be improved. It should be noted that, in the disclosure, one detection pixel is one second photosensitive device 32 and one third photosensitive device 33 with bottom electrodes a electrically connected, or one detection pixel is one first photosensitive device 31 with a bottom electrode a independent of the second photosensitive device 32 and the third photosensitive device 33.

In some embodiments, as shown in FIGS. 2 and 3, each photosensitive device 103 is electrically connected with one reading transistor TFT2. In order to reduce coupling capacitance of the photosensitive device 103 and the reading transistor TFT2, as shown in FIGS. 1, and 4-6, the first photosensitive device 31 may be arranged at a gap between the blue light device (corresponding to the blue color resistor B) and the green light device (corresponding to the green color resistor G). The second photosensitive device 32 may be arranged at a gap between the green light device (corresponding to the green color resistor G) and the red light device (corresponding to the red color resistor R). The third photosensitive device 33 may be arranged at a gap between the red light device (corresponding to the red color resistor R) and the blue light device (corresponding to the blue color resistor B). In this case, an orthographic projection of the first photosensitive device 31 on the substrate 101 is arranged in the same column as an orthographic projection of the red light device (corresponding to the red color resistor R). An orthographic projection of the second photosensitive device 32 on the substrate 101 is arranged in the same column as an orthographic projection of the blue light device (corresponding to the blue color resistor B). An orthographic projection of the third photosensitive device 33 on the substrate 101 is arranged in the same column as an orthographic projection of the green light device (corresponding to the green color resistor G). In the related art, in order to make service life of the red light device, the green light device, and the blue light device approximately equal, the following is generally set: an aperture ratio of the blue light device B>an aperture ratio of the green light device>an aperture ratio of the red light device. Therefore, in the column direction Y, a large space is provided between the first photosensitive device 31 and the red light device, and a reading transistor TFT2 electrically connected with the first photosensitive device 31 can be arranged in the space. A large space is also provided between the second photosensitive device 32 and the blue light device, and a reading transistor TFT2 electrically connected with a common bottom electrode a of the second photosensitive device 32 and the third photosensitive device 33 can be arranged in the space.

Certainly, during specific implementation, positions of the first photosensitive device 31, the second photosensitive device 32, and the third photosensitive device 33 may not be limited to the above arrangement. For example, in case that the first photosensitive device 31, the second photosensitive device 32 and the third photosensitive device 33 all are small, a gap between any two light-emitting devices 102 is sufficient to accommodate the photosensitive device 103 and a reading transistor TFT2 electrically connected with the photosensitive device. In this case, positions of the first photosensitive device 31, the second photosensitive device 32 and the third photosensitive device 33 may be arbitrarily set.

In some embodiments, in the display substrate provided in the embodiments of the disclosure, as shown in FIG. 4, an orthographic projection of the photoelectric conversion layer PIN of the photosensitive device 103 on the substrate 101 may overlap an edge of an orthographic projection of an anode A of an adjacent light-emitting device 102, where the edge extends in the column direction Y. Alternatively, as shown in FIG. 5, an orthographic projection of the photoelectric conversion layer PIN of the photosensitive device 103 on the substrate 101 may not overlap an orthographic projection of an anode A of the light-emitting device 102, which are not specifically limited herein.

Figure 12:
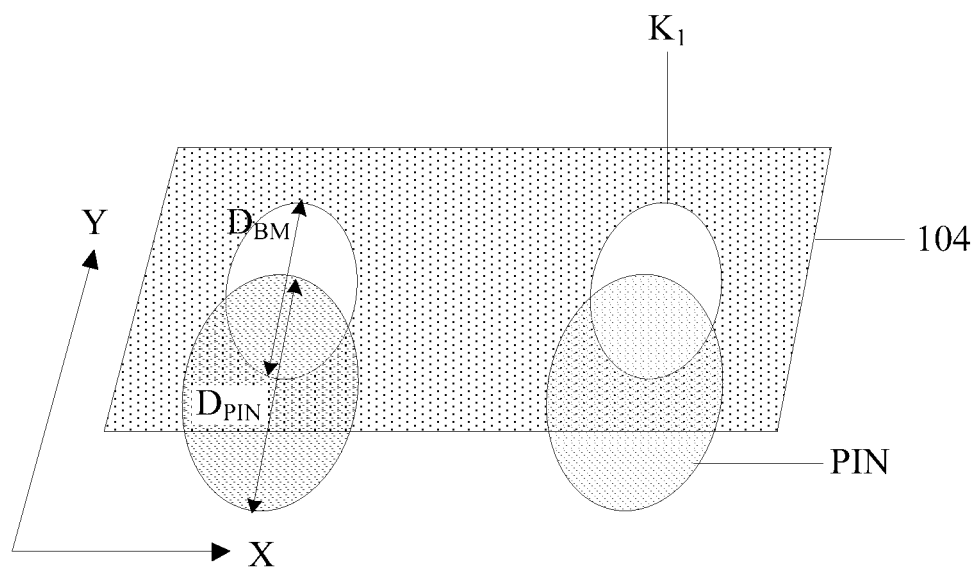
FIG. 12 shows yet another size comparison between a first opening and a photoelectric conversion layer provided in an embodiment of the disclosure.

In some embodiments, as shown in FIGS. 4 and 5, the orthographic projection of the photoelectric conversion layer PIN of the photosensitive device 103 on the substrate 101 may be rectangular. In some other embodiments, as shown in FIG. 6, the photoelectric conversion layer PIN of the first photosensitive device 31 may include a first photoelectric conversion layer (with an effective photosensitive area $S_{11}$) and a second photoelectric conversion layer (with an effective photosensitive area $S_{12}$) independent of each other. Orthographic projections of the first photoelectric conversion layer, the second photoelectric conversion layer, the photoelectric conversion layer PIN of the second photosensitive device 32, and the photoelectric conversion layer PIN of the third photosensitive device 33 on the substrate 101 may each be square or circular (as shown in FIG. 12).

Certainly, during specific implementation, the orthographic projection of the photoelectric conversion layer PIN on the substrate 101 may have another shapes (for example, a regular polygon), which is not limited herein. Accordingly, in order to match the photoelectric conversion layer PIN, the first opening $K_1$ may have the same shape as the photoelectric conversion layer PIN.

Furthermore, the disclosure provides a fingerprint recognition effect illustration for the display substrates shown in FIGS. 4-6, as shown in Table 2. "Proportion" represents a ratio of the amount of fingerprint feature signal to the total amount of light received by the photoelectric conversion layer PIN. "144 μm²" in Table 2 specifically represents the effective photosensitive area $S_{11}$ of the first photoelectric conversion layer or the effective photosensitive area $S_{12}$ of the second photoelectric conversion layer. As can be seen from Table 2, dividing the photoelectric conversion layer PIN of the first photosensitive device 31 into the first photoelectric conversion layer and the second photoelectric conversion layer with smaller areas can improve a collimation degree on the basis of satisfying an effective photosensitive area requirement for fingerprint recognition, improve a valley-ridge illumination difference of a fingerprint, and improve the fingerprint recognition accuracy.

TABLE 2

|  | $S_1$(μm²) | Lx*μm² | Valley-ridge illumination difference | Proportion |
| --- | --- | --- | --- | --- |
| FIG. 4 | 550 | 93.5 | 0.17 | 0.36% |
| FIG. 5 | 360 | 115.2 | 0.32 | 0.68% |
| FIG. 6 | 144 | 136.8 | 0.95 | 2.00% |

Figure 13:
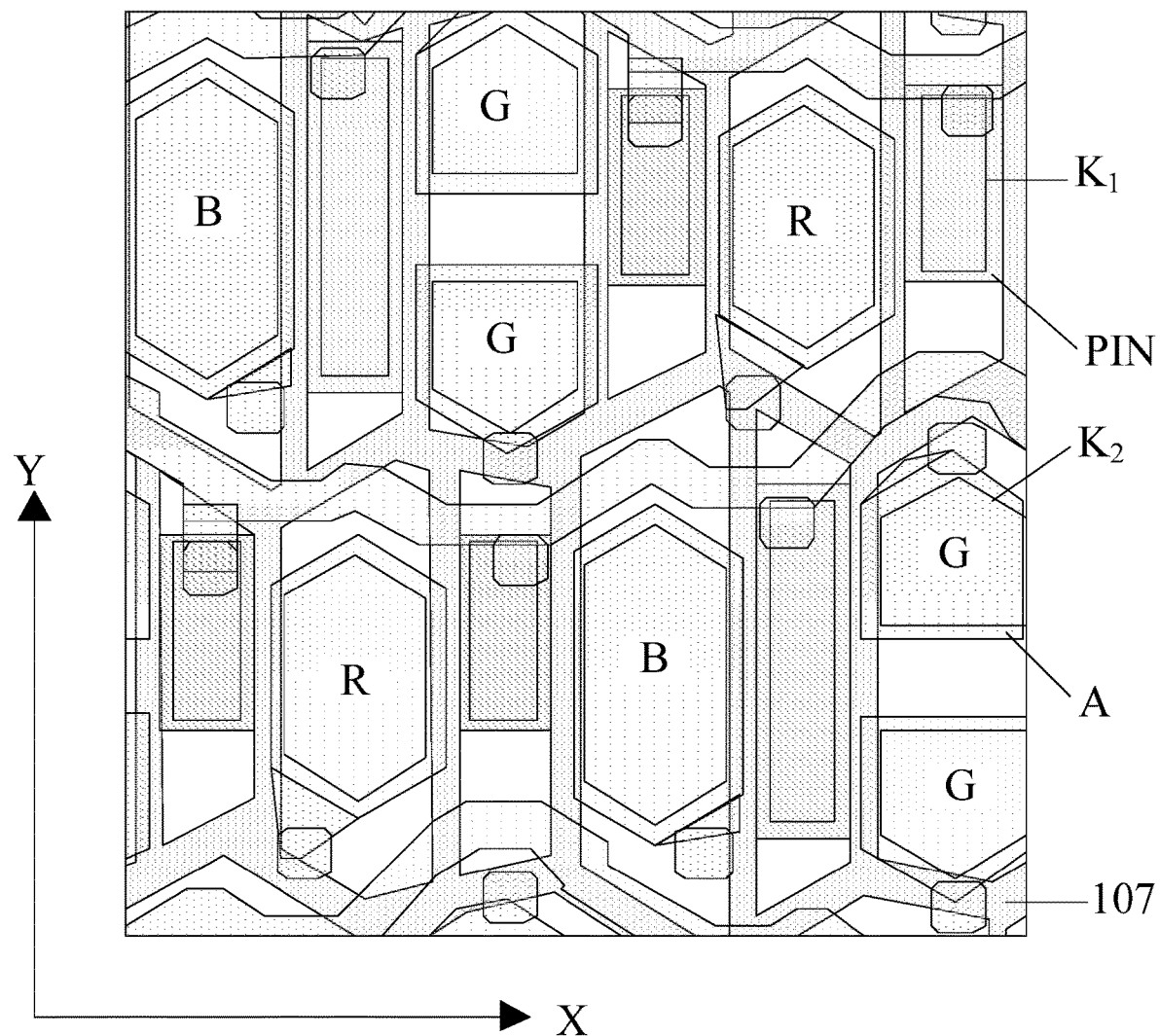
FIG. 13 is yet another schematic structural diagram of region Z shown in FIG. 1.

In some embodiments, in order to implement a touch function, as shown in FIGS. 2, 3 and 13, the display substrate provided in the embodiments of the disclosure may further include a touch grid layer 107 located between the layer where the light-emitting device 102 is located and the black matrix 104. An orthographic projection of the touch grid layer 107 on the substrate 101 is located within the orthographic projection of the black matrix 104, so as to prevent display effect being influenced due to external light from irradiating the touch grid layer 107 and then being reflected out. Moreover, the orthographic projection of the touch grid layer 107 on the substrate 101 does not overlap the orthographic projection of the photoelectric conversion layer PIN of the photosensitive device 103, such that when the light-emitting device 102 is turned on, a situation that the light emitted from the light-emitting device 102 influences a fingerprint signal when radiating upward the touch grid layer 107 and then being reflected to the photosensitive device 103 is prevented.

In some embodiments, in the display substrate provided in the embodiments of the disclosure, as shown in FIG. 13, in a region where any grid of the touch grid layer 107 is located, there is one photoelectric conversion layer PIN of a photosensitive device 103 or one effective light-emitting layer of a light-emitting device 102. This means that lines of touch grids are arranged at two sides of the photoelectric conversion layer PIN extending in the column direction Y. Optionally, in order to guarantee that resistances of the touch grid lines in all directions are relatively uniform, a width of a grid line of the touch grid layer 107 extending in a column direction Y is half of a width of a grid line extending in other directions.

Figure 14:
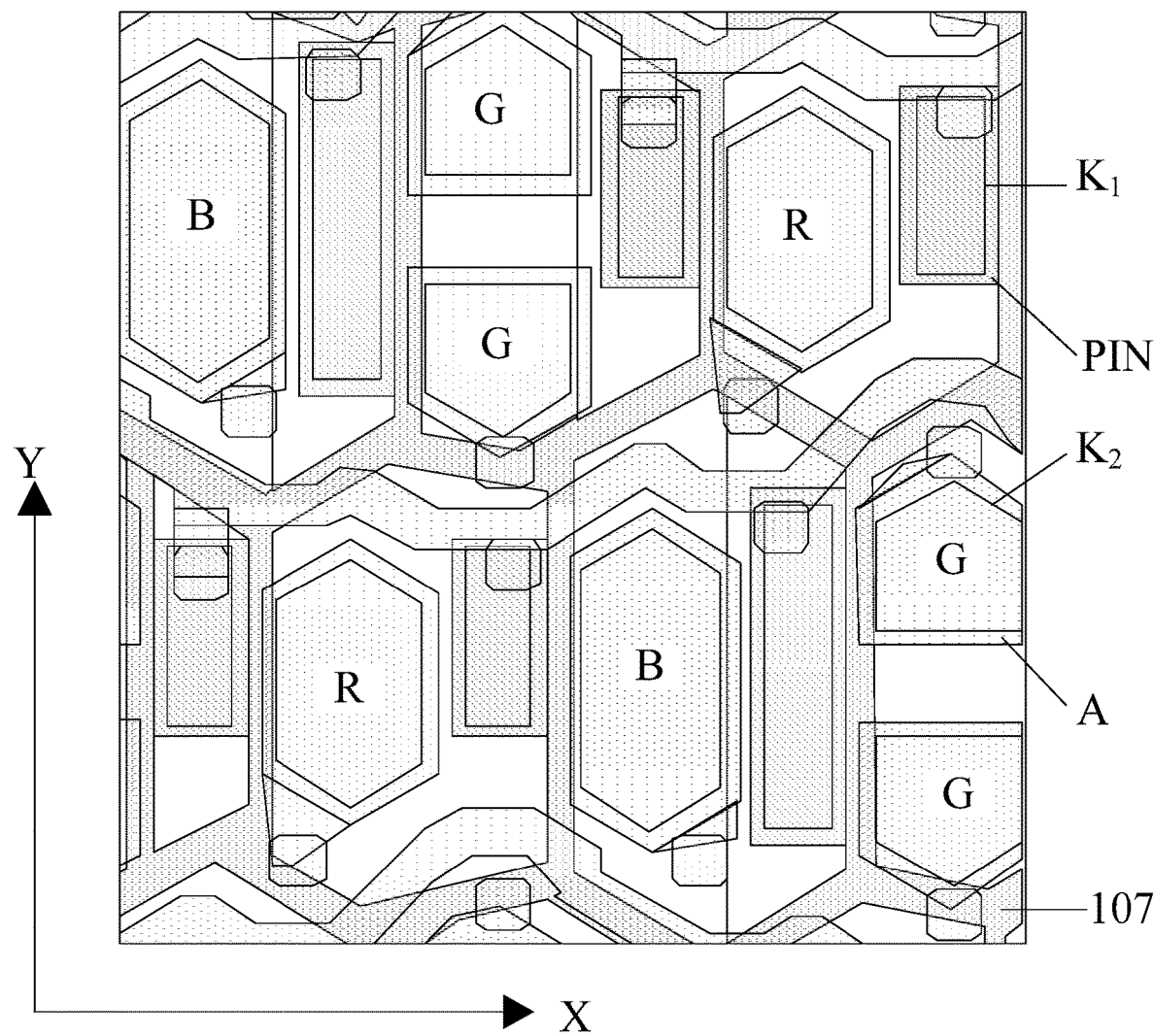
FIG. 14 is still another schematic structural diagram of region Z shown in FIG. 1.
Figure 15:
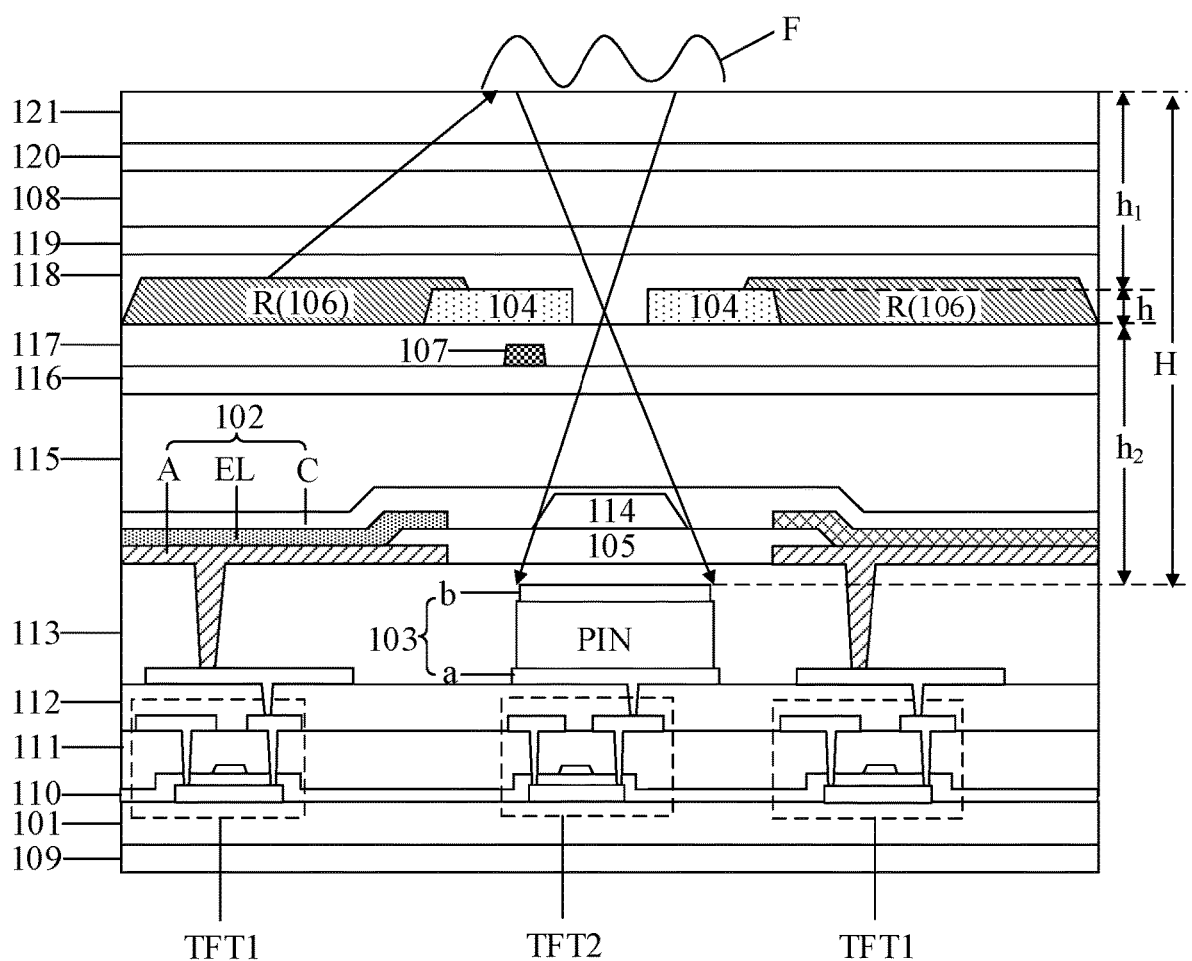
FIG. 15 is yet another schematic diagram of a sectional view along line I-II in FIG. 1.

In some embodiments, in the display substrate provided in the embodiments of the disclosure, as shown in FIGS. 14 and 15, one photoelectric conversion layer PIN of a photo-sensitive device 103 and one effective light-emitting layer of a light-emitting device 102 may be arranged in a region where any grid of the touch grid layer 107 is located. This means that lines of touch grids are arranged at a single side of the photoelectric conversion layer PIN extending in the column direction Y. In this case, the widths of the grid lines of the touch grid layer 107 extending in all directions are set to be approximately equal, such that the resistances of touch grid lines in all directions can be guaranteed to be uniform.

The above two arrangement modes of the touch grid layer 107 allows the touch grids to be uniformly distributed in the region by effectively using a region where the black matrix 104 is located, such that touch sensitivity is high, and a fingerprint recognition effect and a display effect are not influenced. Certainly, during specific implementation, in case that a requirement for touch accuracy is low, a plurality of photosensitive devices 103 and a plurality of light-emitting devices 102 may be arranged in any grid region of the touch grid layer 107 simultaneously, which is not limited herein.

Furthermore, the disclosure further provides an evaluation of an influence of the two touch grid layers 107 in FIGS. 13 and 14 on a fingerprint recognition effect, and results are shown in Table 3. As shown in FIG. 9, $D_{BM}$ represents a side length of the first opening $K_1$, $D_{PIN}$ represents a side length of the photoelectric conversion layer PIN. As shown in FIG. 15, h represents a thickness of the black matrix 104, and generally 1 µm≤ h≤2 µm. The thickness can be omitted, such that $h_1+h_2$ can approximately represent a distance H from the finger contact surface to the photosensitive device 103. It can be seen from Table 3 that the touch grid layer 107 arranged in two ways as shown in FIGS. 13 and 14 has little influence on fingerprint recognition. Especially the way of arranging touch grid lines on two sides of the photoelectric conversion layer PIN extending in the column direction Y as shown in FIG. 13 has almost no influence on a fingerprint recognition effect.

and further provide better optical clarity. Moreover, the ultra-thin glass cover plate 108 is not prone to creases and has desirable reliability. The ultra-thin glass cover plate is not naturally decomposed like plastic, and has long service life, thus providing more stable and reliable protection for a display screen.

In some embodiments, as shown in FIG. 15, the display substrate provided in the embodiments of the disclosure may further include a drive transistor TFT1, a back film 109, a gate insulating layer 110, an interlayer dielectric layer 111, a first insulating layer 112, a resin layer 113, a support layer 114, an encapsulation layer 115, a buffer layer 116, a first planarization layer 117, a second planarization layer 118, a first adhesive layer 119, a second adhesive layer 120, and a transparent protection layer 121. Other essential components of the display substrate will be understood by those of ordinary skill in the art, and are not repeated herein, nor are they intended to be limiting of the disclosure.

Based on the same inventive concept, an embodiment of the disclosure provides a display device. The display device includes the display substrate provided in the embodiment of the disclosure. Since the principle for solving a problem of the display device is similar to that of the display substrate, reference may be made to the implementation of the display substrate provided in the embodiment of the disclosure for the implementation of the display device provided in the embodiment of the disclosure, which is not repeated herein.

In some embodiments, the display device may be any product or part with a display function, for example, a mobile phone, a tablet personal computer, a television, a display, a notebook computer, a digital photo frame, a navigator, a smart watch, a fitness wristband, a personal digital assistant, etc. The display device includes, but is not limited to, a radio frequency unit, a network module, an audio output & input unit, a sensor, a display unit, a user input unit, an interface unit, a memory, a processor, a power supply, etc. Moreover, those skilled in the art can understand that the above structure does not constitute a limitation on the above display device provided in the embodiments of the disclosure. In other words, the above display device pro-

TABLE 3

| | $D_{BM}$ | $D_{PIN}$ | $D_{PIN}/D_{BM}$ | $h_2/(h_1 + h_2)$ | Light receiving angle/central transmittance | Light source | Valley-ridge illumination difference |
|---|---|---|---|---|---|---|---|
| No touch grid layer | 24 µm | 30 µm | 1:0.8 | 18 µm/220 µm | 61°/1 | 1 lm | 0.5 |
| FIG. 13 | | | | | | | 0.51 |
| FIG. 14 | | | | | | | 0.42 |

In some embodiments, as shown in FIG. 15, the display substrate provided in the embodiments of the disclosure may further include an ultra-thin glass cover plate 108 on a side of the black matrix 104 facing away from the substrate 101. Since the ultra-thin glass cover plate 108 maintains characteristics of glass and has desirable flexibility, it can fully satisfy requirements of folding products.

Specifically, ultra-thin glass (UTG) refers to a glass layer with a thickness of dozens of microns or less, which can be bent and deformed, and can be folded. In the disclosure, the thickness of the ultra-thin glass cover plate 108 is about 50 µm. Compared with a polymer plastic film, the ultra-thin glass cover plate 108 can effectively avoid screen damage vided in the embodiments of the disclosure may include more or less of the above components, or combine some components, or arrange different components.

Figure 16:
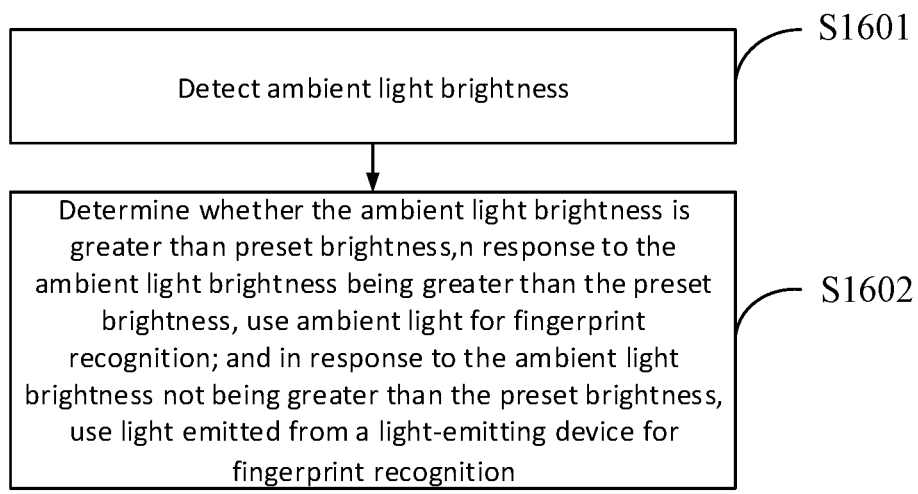
FIG. 16 is a flowchart of a fingerprint recognition method provided in an embodiment of the disclosure.

Based on the same inventive concept, an embodiment of the disclosure further provides a fingerprint recognition method. As shown in FIG. 16, the fingerprint recognition method may include:

S1601, detect ambient light brightness; and

S1602, determine whether the ambient light brightness is greater than preset brightness, in response to the ambient light brightness being greater than the preset brightness, use ambient light for fingerprint recognition, and in response to the ambient light brightness being lower than the preset brightness, use light emitted from a light-emitting device for fingerprint recognition.

Specifically, in the case of fingerprint recognition using the light emitted from the light-emitting device 102, when the finger F contacts a transparent protection layer 121 of the display device, a surface light source is turned on by controlling the light-emitting device 102, to emit light. The light is emitted from a light-emitting material layer of the light-emitting device 102, then reaches a fingerprint interface upward through an encapsulation layer 115, a color resistor 106, an ultra-thin glass cover plate 108, a transparent protection layer 121 and other film layers separately. Light reflected and scattered by a fingerprint on the interface reaches the photosensitive device 103 through the transparent protection layer 121, the ultra-thin glass cover plate 108, a first opening $K_1$, the encapsulation layer 115, a support layer 114, a pixel defining layer 105 and other film layers, and is received by a photoelectric conversion layer PIN of a photosensitive device 103 and converted into electrical signals. Signals reflected by valleys and ridges are different, such that fingerprint recognition is implemented.

In the case of fingerprint recognition using ambient light, when the finger F contacts the transparent protection layer 121 of the display device, ambient light passes through the finger F, reaches the photosensitive device 103 downward through the transparent protection layer 121, the ultra-thin glass cover plate 108, the first opening $K_1$, the encapsulation layer 115, the support layer 114, the pixel defining layer 105 and other film layers, and is received by the photoelectric conversion layer PIN of the photosensitive device 103 and converted into electrical signals. Signals reflected by the valleys and the ridges are different, such that fingerprint recognition is implemented.

While the preferred embodiments of the disclosure have been described, those skilled in the art can made various modifications and variations to the embodiments of the disclosure without departing from the spirit and scope of the embodiments of the disclosure. Thus, if modifications and variations to the embodiments of the disclosure fall within the scope of the appended claims of the disclosure and their equivalents, the disclosure is intended to include such modifications and variations as well.

What is claimed is:

1. A display substrate, comprising:
   a substrate;
   a plurality of light-emitting devices arranged in an array on the substrate;
   a plurality of photosensitive devices between a layer where the light-emitting devices are located and the substrate, wherein an orthographic projection of each photosensitive device on the substrate overlaps a gap between orthographic projections of adjacent light-emitting devices; and
   a black matrix on a side of the layer where the light-emitting devices are located facing away from the substrate, wherein an orthographic projection of the black matrix on the substrate overlaps the gap between the orthographic projections of adjacent light-emitting devices, the black matrix comprises a plurality of first openings, and an orthographic projection of the first opening on the substrate overlaps the orthographic projection of the photosensitive device; and a total amount of light irradiating the photosensitive devices through the first openings satisfies a requirement of a signal-to-noise ratio of fingerprint recognition and is less than an amount of light required for a full-well capacity of the photosensitive devices;
   wherein the first openings overlap photoelectric conversion layers of the photosensitive devices in a one-to-one correspondence manner, and a center of an orthographic projection of the first opening on the substrate approximately coincides with a center of an orthographic projection of the photoelectric conversion layer of a corresponding photosensitive device;
   wherein the orthographic projection of the first opening on the substrate is located within the orthographic projection of the photoelectric conversion layer of the corresponding photosensitive device;
   wherein an optical comprehensive transmittance T of ambient light reaching the photosensitive devices through a finger and the first openings satisfies a following expression:

$$0 < T < k*K_s*K_L;$$

wherein k is a coefficient, $K_S$ is a ratio of a width of the first opening to a width of the photoelectric conversion layer of the corresponding photosensitive device in a row direction, and $K_L$ is a ratio of a length of the first opening to a length of the photoelectric conversion layer of the corresponding photosensitive device in a column direction;

wherein a light receiving angle α determined based on the first opening satisfies a following expression:

$$\alpha = \arctan[P/(2h_1)],$$
$$\text{and } 0 < (D_{LPIN} + D_{LBM})/(2*h_2) < \alpha;$$

wherein P is a distance between two adjacent valley centers or two adjacent ridge centers of a fingerprint; $h_1$ is a distance from a contact surface of a finger and the display substrate to the black matrix; $h_2$ is a distance from the black matrix to the photosensitive devices; $D_{LPIN}$ is the length of the photoelectric conversion layer of the photosensitive device in the column direction; and $D_{LBM}$ is the length of the first opening in the column direction.

2. The display substrate according to claim 1, wherein
   $0<k<0.4$;
   $0<K_S<0.75$;
   $0<K_L<0.75$;
   $8\ \mu m \leq D_{LPIN} \leq 40\ \mu m$;
   $50\ \mu m \leq h_1 \leq 200\ \mu m$;
   $8\ \mu m \leq h_2 \leq 20\ \mu m$;
   $300\ \mu m \leq P \leq 500\ \mu m$; and
   $8\ \mu m \leq D_{SPIN} \leq 20\ \mu m$;
   wherein $D_{SPIN}$ is the width of the photoelectric conversion layer of the photosensitive device in the row direction.

3. The display substrate according to claim 1, further comprising red resin filling the first openings, wherein
   the orthographic projection of the first opening on the substrate is greater than or equal to the orthographic projection of the photoelectric conversion layer of the corresponding photosensitive device.

4. The display substrate according to claim 3, wherein a ratio of a width of the first openings to a width of the photoelectric conversion layer of the corresponding photosensitive device in a row direction is greater than or equal to 1 and less than 2; and a ratio of a length of the first opening to a length of the photoelectric conversion layer of the corresponding photosensitive device in a column direction is greater than or equal to 1 and less than 2.

5. The display substrate according to claim 3, further comprising: a plurality of color resistors on a side of the black matrix facing away from the substrate;
wherein the color resistors comprise red color resistors, and the red color resistors are disposed in a same layer and made of a same material as the red resin; and
the black matrix further comprises a plurality of second openings, the color resistors are located at the second openings, and an orthographic projection of the color resistor on the substrate overlaps the orthographic projection of the light-emitting device.

6. The display substrate according to claim 1, wherein every three adjacent photosensitive devices in a same row are a first photosensitive device, a second photosensitive device and a third photosensitive device respectively; and
in two adjacent rows, a column where the first photosensitive device is located is located between a column where the second photosensitive device is located and a column where the third photosensitive device is located;
for the first photosensitive device, the second photosensitive device, and the third photosensitive device that are adjacent in the same row:
a bottom electrode of the first photosensitive device is independent of a bottom electrode of the second photosensitive device and a bottom electrode of the third photosensitive device, and the bottom electrode of the second photosensitive device is electrically connected with the bottom electrode of the third photosensitive device; and
an area of the photoelectric conversion layer of the photosensitive device which is not shielded by an anode of the light-emitting device is an effective photosensitive area, and an effective photosensitive area of the first photosensitive device is equal to a sum of an effective photosensitive area of the second photosensitive device and an effective photosensitive area of the third photosensitive device.

7. The display substrate according to claim 6, wherein an orthographic projection of the photoelectric conversion layer of the photosensitive device on the substrate overlaps an edge of an orthographic projection of an anode of an adjacent light-emitting device, wherein the edge extends in the column direction; or an orthographic projection of the photoelectric conversion layer of the photosensitive device on the substrate does not overlap an orthographic projection of an anode of the light-emitting device.

8. The display substrate according to claim 7, wherein the orthographic projection of the photoelectric conversion layer of the photosensitive device on the substrate is rectangular.

9. The display substrate according to claim 6, wherein photoelectric conversion layer of the first photosensitive device comprise a first photoelectric conversion layer and a second photoelectric conversion layer independent of each other.

10. The display substrate according to claim 9, wherein orthographic projections of the first photoelectric conversion layer, the second photoelectric conversion layer, a photoelectric conversion layer of the second photosensitive device, and a photoelectric conversion layer of the third photosensitive device on the substrate are all square or circular.

11. The display substrate according to claim 1, further comprising a touch grid layer between the layer where the light-emitting devices are located and the black matrix, wherein an orthographic projection of the touch grid layer on the substrate is located within the orthographic projection of the black matrix, and the orthographic projection of the touch grid layer on the substrate does not overlap the orthographic projection of the photoelectric conversion layer of the photosensitive device.

12. The display substrate according to claim 11, wherein a photoelectric conversion layer of one photosensitive device or an effective light-emitting layer of one light-emitting device is arranged in a region where any grid of the touch grid layer is located;
wherein a width of a grid line of the touch grid layer extending in a column direction is half of a width of a grid line extending in other directions.

13. The display substrate according to claim 11, wherein a photoelectric conversion layer of one photosensitive device and an effective light-emitting layer of one light-emitting device are arranged in a region where any grid of the touch grid layer is located;
wherein widths of grid lines of the touch grid layer extending in all directions are approximately equal.

14. The display substrate according to claim 1, further comprising an ultra-thin glass cover plate on a side of the black matrix facing away from the substrate.

15. A display device, comprising the display substrate according to claim 1.

* * * * *